US010305462B1

(12) United States Patent
Wang et al.

(10) Patent No.: US 10,305,462 B1
(45) Date of Patent: May 28, 2019

(54) HIGH-SPEED INTERNAL HYSTERESIS COMPARATOR

(71) Applicant: VIA Technologies, Inc., New Taipei (TW)

(72) Inventors: Wei-Yu Wang, New Taipei (TW); Yu-Chung Wei, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/921,682

(22) Filed: Mar. 15, 2018

(30) Foreign Application Priority Data

Jan. 10, 2018 (TW) .............................. 107101001 A

(51) Int. Cl.
*H03F 3/195* (2006.01)
*H03F 3/45* (2006.01)
*H03K 5/22* (2006.01)
*H03K 5/24* (2006.01)

(52) U.S. Cl.
CPC ........... *H03K 5/2481* (2013.01); *H03F 3/195* (2013.01); *H03F 3/45264* (2013.01); *H03F 2200/387* (2013.01); *H03F 2203/45022* (2013.01); *H03F 2203/45026* (2013.01)

(58) Field of Classification Search
USPC ........................................ 330/252–261, 288
See application file for complete search history.

(56) References Cited

U.S. PATENT DOCUMENTS

| | | | | |
|---|---|---|---|---|
| 5,764,086 A | * | 6/1998 | Nagamatsu | H03K 5/2481 327/52 |
| 5,966,050 A | * | 10/1999 | Yoshino | H03F 1/307 330/255 |
| 6,400,219 B1 | | 6/2002 | Fayed | |
| 8,570,072 B2 | * | 10/2013 | Gozali | H03K 3/3565 327/205 |
| 10,056,892 B2 | * | 8/2018 | Nicollini | H03K 5/2481 |
| 2002/0030542 A1 | | 3/2002 | Yasukouchi | |
| 2013/0120025 A1 | | 5/2013 | Inoue | |

OTHER PUBLICATIONS

"Office Action of Taiwan Counterpart Application", dated Jun. 4, 2018, p. 1-p. 5.

\* cited by examiner

*Primary Examiner* — Hieu P Nguyen
(74) *Attorney, Agent, or Firm* — JCIPRNET

(57) ABSTRACT

A high speed internal hysteresis comparator is provided. Impedance supply units are disposed at control terminals of transistors of an active load of a differential amplifier of the high-speed hysteresis comparator, such that a gain when the transistors operate in an active region and a responding speed of the high-speed hysteresis comparator are increased.

8 Claims, 6 Drawing Sheets

HIGH-SPEED INTERNAL HYSTERESIS COMPARATOR

CROSS-REFERENCE TO RELATED APPLICATION

This application claims the priority benefit of Taiwan application serial no. 107101001, filed on Jan. 10, 2018. The entirety of the above-mentioned patent application is hereby incorporated by reference herein and made a part of this specification.

BACKGROUND

Technical Field

The disclosure relates to a comparator, particularly to a high-speed internal hysteresis comparator.

Description of Related Art

In the circuits of a variety of A/D converters (e.g. flash ADC, interpolation ADC, pipeline ADC, and two step ADC) and high-speed receivers for RX signal, high-speed comparative circuits are usually required to satisfy the demands for high-speed operation in the current digital circuits. In general, the difference between the signal amplitudes of the signal part and the noise part in input signals of high transmitting speed is relatively small. To allow a comparator to output a correct comparing result correspondent to the signal part of an input signal, the current of the current source in the comparator is usually increased or an additional pre-buffer is usually disposed in the circuit of the comparator. The known technology, however, has problems such as high power consumption, high costs, increase in the circuit area, etc.

SUMMARY

A high-speed internal hysteresis comparator is provided in this disclosure. The high-speed internal hysteresis comparator is able to correctly obtain the signal part in input signals of high transmitting speed without causing problems such as high power consumption, high costs, increase in the circuit area, etc.

The high-speed internal hysteresis comparator of the disclosure includes a differential amplifier. An active load of the differential amplifier is coupled to an electrical source terminal and an output terminal of the different amplifier. The active load includes a first transistor, a second transistor, a third transistor, a fourth transistor, a first impedance supply unit, and a second impedance supply unit. A first terminal and a second terminal of the first transistor are respectively coupled to the electrical source terminal of the differential amplifier and a first output terminal of the differential amplifier. A first terminal and a second terminal of the second transistor are respectively coupled to the electrical source terminal of the differential amplifier and a second output terminal of the differential amplifier. A control terminal of the second transistor is further coupled to the second terminal of the first transistor. The first impedance supply unit is coupled between a control terminal of the first transistor and the control terminal of the second transistor. The first impedance supply unit is used to supply first impedance. A first terminal and a second terminal of the third transistor are respectively coupled to the electrical source terminal of the differential amplifier and the second output terminal of the differential amplifier. A first terminal and a second terminal of the fourth transistor are respectively coupled to the electrical source terminal of the differential amplifier and the first output terminal of the differential amplifier. A control terminal of the fourth transistor is further coupled to the second terminal of the third transistor. The second impedance supply unit is coupled between a control terminal of the third transistor and the control terminal of the fourth transistor. The second impedance supply unit is used to supply second impedance.

According to an embodiment of the disclosure, the first impedance supply unit and the second impedance supply unit enable output impedance at the output terminal of the differential amplifier to have features of an inductive load in a small-signal model.

According to an embodiment of the disclosure, the first impedance supply unit and the second impedance supply unit respectively include electrical resistance.

According to an embodiment of the disclosure, the first impedance supply unit and the second impedance supply unit respectively include a transistor.

According to an embodiment of the disclosure, the differential amplifier further includes a differential pair coupled to the active load and a current terminal of the differential amplifier, and receives a differential input signal.

According to an embodiment of the disclosure, a transmitting speed of the differential input signal is greater than or equal to 6 Gb/s.

According to an embodiment of the disclosure, the high-speed internal hysteresis comparator further includes a current source circuit coupled to the current terminal of the differential amplifier.

According to an embodiment of the disclosure, the high-speed internal hysteresis comparator further includes an output circuit coupled to the first output terminal of the differential amplifier and the second output terminal of the differential amplifier. A comparative signal is output from the output terminal of the differential amplifier according to a signal at the first output terminal of the differential amplifier and a signal at the second output terminal of the differential amplifier.

Based on the foregoing, in the embodiments of the disclosure, impedance supply units are disposed at control terminals of transistors of an active load of the differential amplifier such that the transistors are inductive and high-frequency impedance when the transistors of the active load operate in an active region is increased. A high-frequency gain and a responding speed of the high-speed internal hysteresis comparator are thus increased. The high-speed internal hysteresis comparator thus outputs a correct comparing result correspondent to an input signal of high transmitting speed without causing problems such as high power consumption, high cost, increase in circuit area, etc.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
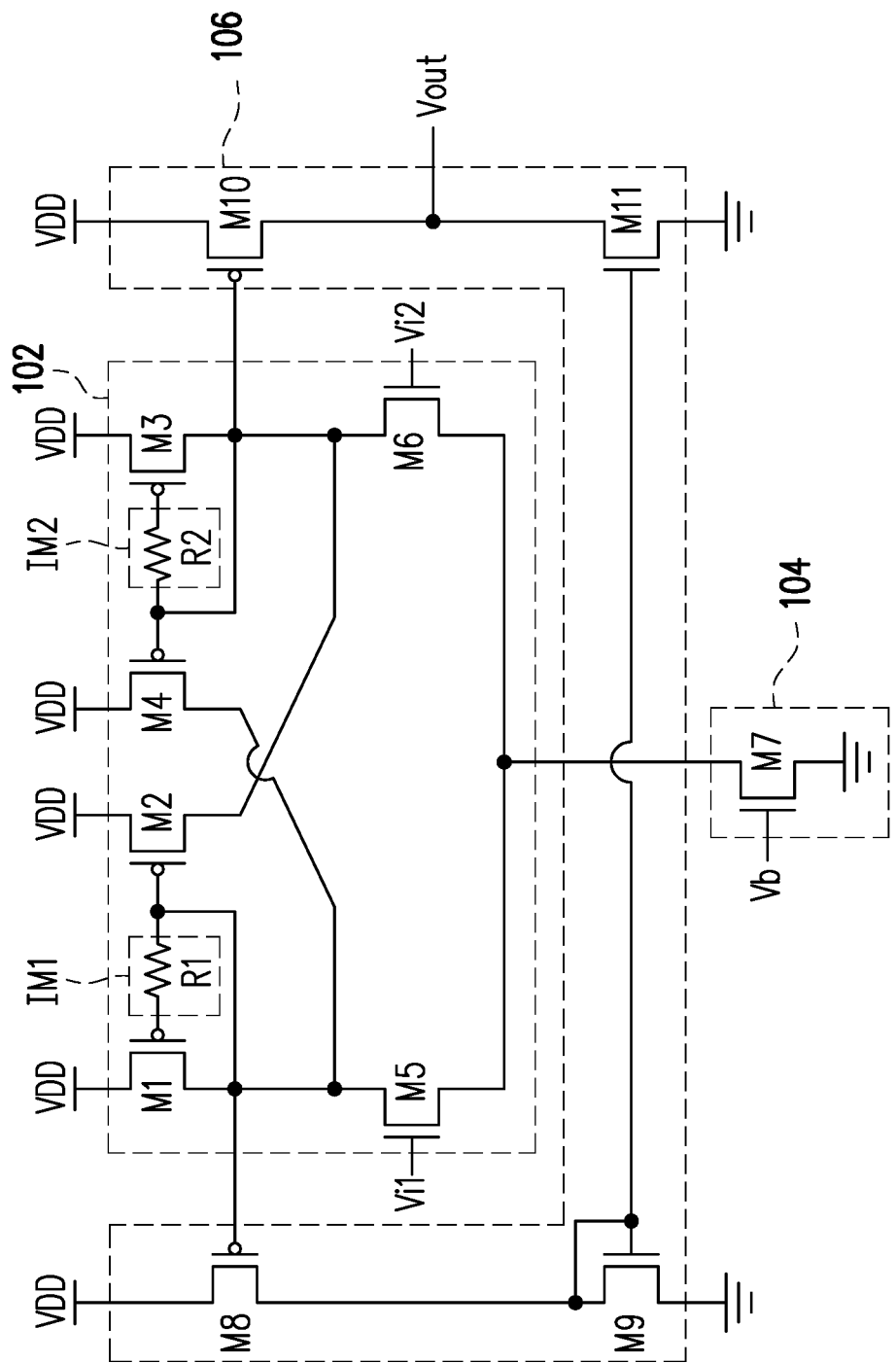
FIG. 1 is a schematic diagram of a high-speed internal hysteresis comparator according to an embodiment of the disclosure.

FIG. 1 is a schematic diagram of a high-speed internal hysteresis comparator according to an embodiment of the disclosure. Referring to FIG. 1, the high-speed internal hysteresis comparator may include, for example, a differential amplifier 102, a current source circuit 104, and an output circuit 106. The differential amplifier 102 may include, for example, an active load and a differential pair. The active load may include, for example, transistors M1, M2, M3, and M4 and impedance supply units IM1 and IM2. The differential pair may include, for example, transistors M5 and M6. According to this embodiment, the transistors M1 to M4 are P-type transistors, while the transistors M5 and M6 are N-type transistors. Moreover, electrical resistances R1 and R2, for example, may be respectively employed as the impedance supply units IM1 and IM2. According to some embodiments, transistors, for example, may be employed as the impedance supply units IM1 and IM2, wherein the transistor M1 is coupled between an electrical source voltage VDD (i.e. coupled to an electrical source terminal of the differential amplifier 102 to receive the electrical source voltage VDD) and a first output terminal of the differential amplifier 102. A control terminal (a gate) of the transistor M1 is coupled to a gate of the transistor M2 through the impedance supply unit IM1. The transistor M2 is coupled between the electrical source voltage VDD and a second output terminal of the differential amplifier 102. The gate of the transistor M2 is further coupled to the first output terminal of the differential amplifier 102. The transistor M3 is coupled between the electrical source voltage VDD and a second output terminal of the differential amplifier 102. A gate of the transistor M3 is coupled to a gate of the transistor M4 through the impedance supply unit IM2. The transistor M4 is coupled between the electrical source voltage VDD and the first output terminal of the differential amplifier 102. The gate of the transistor M4 is further coupled to the second output terminal of the differential amplifier 102. Moreover, the transistor M5 in the differential pair is coupled between the transistor M1 and the electrical source terminal (i.e. coupled to the current source circuit 104) of the differential amplifier 102. The transistor M6 is coupled between the transistor M3 and the electrical source terminal of the differential amplifier 102. Gates of the transistor M5 the transistor M6 are used to receive differential input signals Vi1 and Vi2, wherein the differential input signals Vi1 and Vi2 may be, for example, signals matching standards for serial advanced technology attachment (SATA). Nevertheless, the disclosure is not limited thereto. The differential input signals Vi1 and Vi2 may also be, for example, other signals having a transmitting speed greater than or equal to 6 Gb/s or signals having a transmitting speed lower than 6 Gb/s.

According to this embodiment, the current source circuit 104 may include a transistor M7 coupled between the electrical source terminal of the differential amplifier 102 and ground. A gate of the transistor M7 is used to receive a bias voltage Vb. Moreover, the output circuit according to this embodiment may include transistors M8, M9, M10, and M11, wherein the transistors M8 and M10 are P-type transistors while the transistors M9 and M11 are N-type transistors. The transistors M8 and M9 are connected in series between the electrical source voltage VDD and ground. A gate of the transistor M8 is coupled to the first output terminal of the differential amplifier 102. A gate of the transistor M9 is coupled to a gate of the transistor M11 and is also coupled to a drain of the transistor M9. The transistors M10 and M11 are coupled between the electrical source voltage VDD and ground. A gate of the transistor M10 is coupled to the second output terminal of the differential amplifier 102. A mutual joint of the transistors M10 and M11 serves as an output terminal of the high-speed internal hysteresis comparator.

The high-speed internal hysteresis comparator compares the differential input signals Vi1 and Vi2 received by the differential amplifier 102 and outputs a comparing signal Vout from the output terminal. The impedance supply units IM1 and IM2 are respectively disposed at the gates of transistors M1 and M3 of the active load of the differential amplifier 102 such that a high-frequency gain when the transistor M6 operates in an active region and a responding speed of the high-speed internal hysteresis comparator are increased. The high-speed internal hysteresis comparator thus outputs a correct comparing result correspondent to an input signal of high transmitting speed without requiring an increase of a current of the current source or a disposition of a pre-buffer as prior art does. Hence, the high-speed internal hysteresis comparator does not cause problems such as high power consumption, high cost, increase in circuit area, etc. It should be noted that according to some embodiments of the disclosure, input signals having a transmitting speed lower than 6 Gb/s may also be applied in the high-speed internal hysteresis comparator and could also have the effect of increasing a responding speed of the high-speed internal hysteresis comparator.

Figure 2:
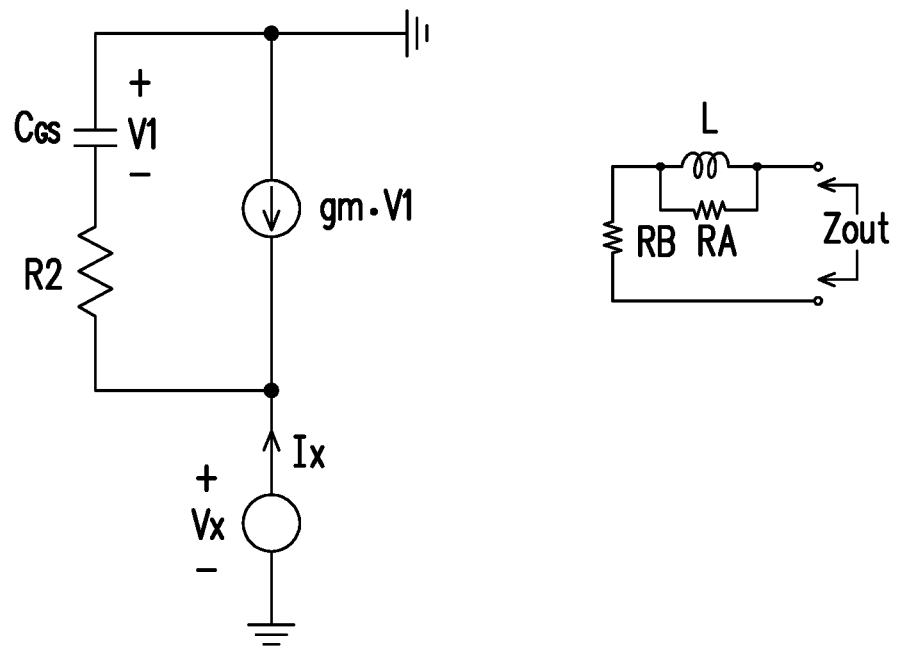
FIG. 2 is a schematic diagram of a small-signal model and a simplified network of a circuit consists of a transistor and an impedance supply unit according to an embodiment of the disclosure.

FIG. 2 is a schematic diagram of a small-signal model and a simplified network of a circuit consists of a transistor and an impedance supply unit according to an embodiment of the disclosure. Referring to FIG. 2, FIG. 2 is a small-signal model of a circuit consists of the transistor M3 and electrical resistance R2, wherein Equation (1) and Equation (2) as below may be obtained respectively according to Kirchhoff's current law and Kirchhoff's voltage law:

$$V1 \cdot C_{GS} \cdot s + gm \cdot V1 = -Ix \quad (1)$$

$$V1 \cdot C_{GS} \cdot s \cdot R2 + V1 = -Vx \quad (2)$$

$C_{GS}$ in the Equations (1) and (2) is parasitic capacitance between the gate and a source of the transistor M3. V1 is a cross voltage on the capacitance $C_{GS}$. gm is transduction of the transistor M3. Ix is a test current and Vx is a text voltage. Equivalent impedance Zout at the output terminal of the differential amplifier 102 may be calculated from Equation (1) and Equation (2) and shown as Equation (3) below:

$$Zout = \frac{R2 \cdot C_{GS} \cdot s + 1}{gm + C_{GS} \cdot s} \quad (3)$$

Moreover, the simplified network may include electrical resistances RA and RB and inductance L, wherein the electrical resistance RB is connected in series with the electrical resistance RA and the inductance L that are connected together in parallel. Equivalent impedance of the simplified network is Zout, wherein the electrical resistances RA and RB and the inductance L may be shown as Equations below:

$$RA = R2 - \frac{1}{gm} \quad (4)$$

$$RB = \frac{1}{gm} \quad (5)$$

$$L = \frac{C_{GS}}{gm}\left(R2 - \frac{1}{gm}\right) \quad (6)$$

The Equation (3) above is a characteristic equation of output electrical resistance upon Laplace transformation, wherein a pole is defined in the numerator and a zero is defined in the denominator. When s in the Equation (3) is 0, electrical resistance of the equivalent impedance Zout equals 1/gm; when s is infinite, electrical resistance of the equivalent impedance Zout equals R2. Moreover, the equivalent impedance Zout has features of an inductive load when the electrical resistance R2 is far greater than 1/gm. In other words, the equivalent impedance Zout increases as a frequency increases. Hence, the output terminal of the differential amplifier 102 has the equivalent impedance Zout having a relatively high high-frequency electrical resistance when the high-speed internal hysteresis comparator receives signals of high transmitting speed. As a result, a gain of the transistor M6 operating in an active region is effectively increased and a responding speed of the high-speed internal hysteresis comparator is further increased. The high-speed internal hysteresis comparator thus outputs a correct comparing result.

Figure 3:
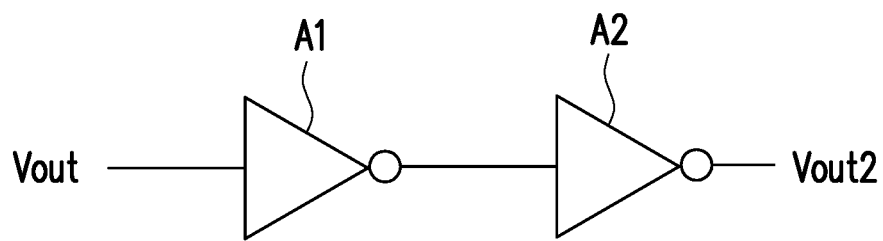
FIG. 3 is a schematic diagram of a circuit of a digital logic circuit according to an embodiment of the disclosure.
Figure 4A:
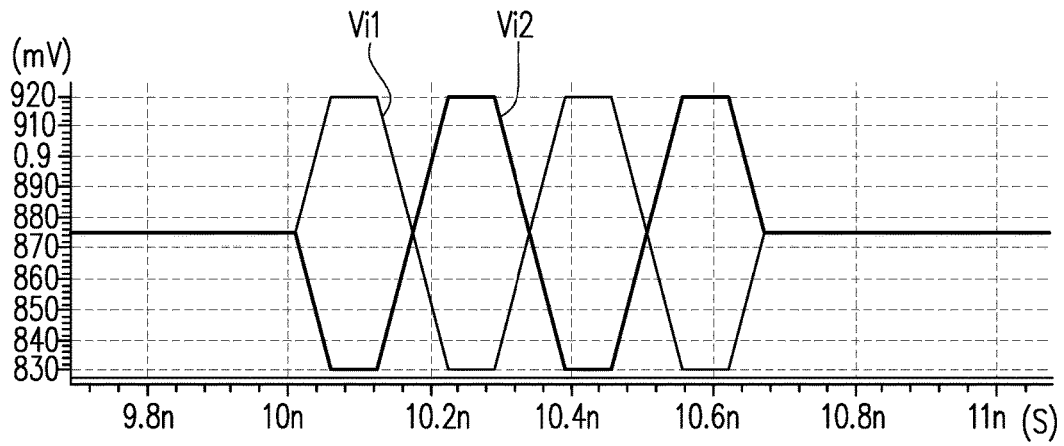
FIG. 4A is a schematic oscillogram of a differential input signal according to an embodiment of the disclosure.
Figure 4B:
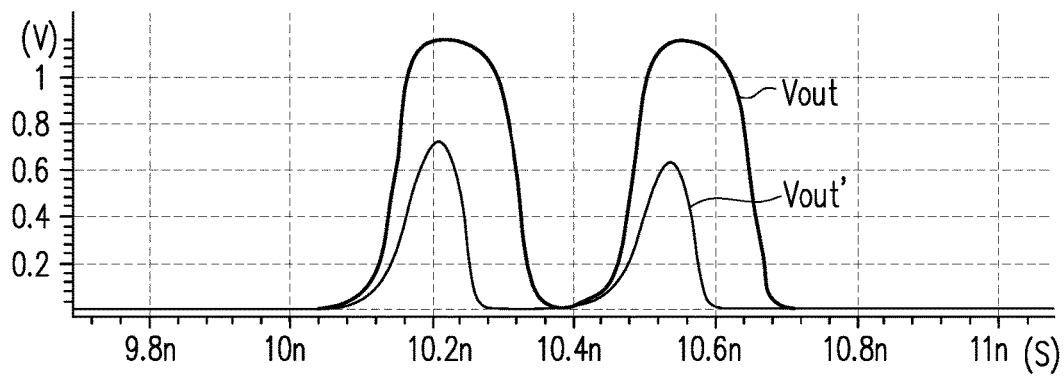
FIG. 4B is a schematic oscillogram of output signals of a high-speed internal hysteresis comparator according to embodiments of the disclosure and a comparator according to prior art.
Figure 4C:
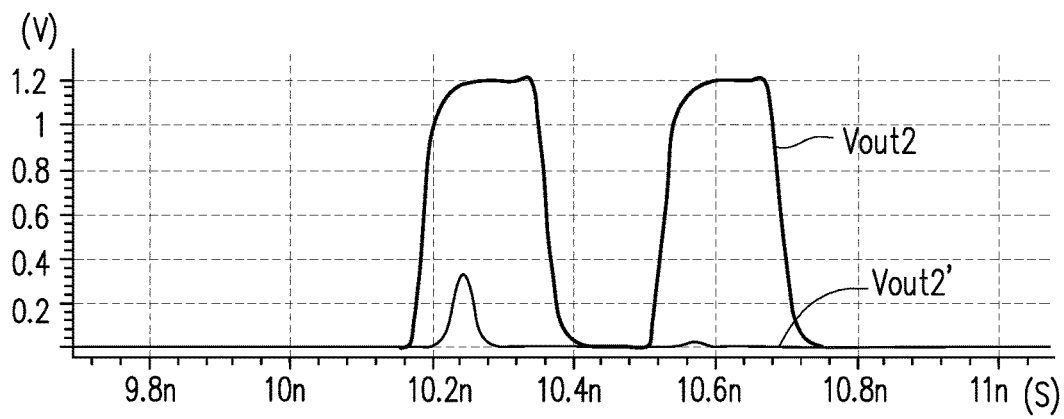
FIG. 4C is a schematic oscillogram of output signals of digital logic circuits according to embodiments of the disclosure and prior art.

According to some embodiments, the output terminal of the high-speed internal hysteresis comparator may be coupled to a digital logic circuit. As shown in FIG. 3, the digital logic circuit according to the embodiment in FIG. 3 consists of two invertors A1 and A2 connected in series. An input terminal of the invertor A1 is used to receive a comparing signal Vout, while an output terminal of the invertor A2 is used to output an output signal Vout2 that is inverted twice. FIG. 4A is a schematic oscillogram of a differential input signal according to an embodiment of the disclosure. FIG. 4B is a schematic oscillogram of output signals of a high-speed internal hysteresis comparator according to embodiments of the disclosure and a comparator according to prior art. FIG. 4C is a schematic oscillogram of output signals of digital logic circuits according to embodiments of the disclosure and prior art. Referring to FIG. 4A to FIG. 4C, as shown in FIG. 4A, the input signals Vi1 and Vi2 according to this embodiment are inverted signals. In FIG. 4B, however, a comparing signal Vout' is a comparing signal output by a comparator of prior art, where the impedance supply units IM1 and IM2 are not disposed. In view of FIG. 4B, the high-speed internal hysteresis comparator according to this embodiment may respond to the differential input signals Vi1 and Vi2 of high transmitting speed and correctly outputs waveforms of full swings with use of the impedance supply units IM1 and IM2 respectively disposed at the gates of the transistors M1 and M3. Comparators of prior art, on the contrary, cannot respond to the differential input signals Vi1 and Vi2 of high transmitting speed and output waveforms of full swings. Moreover, an amplitude of the comparing signal Vout' output by the comparator of prior art further attenuates to approaching 0V (Vout2') after the comparing signal Vout' is inverted by the invertors A1 and A2. The comparator of prior art thus cannot output a correct waveform. On the contrary, the comparing signal Vout output by the high-speed internal hysteresis comparator according to this embodiment may still output full swings after being inverted by the invertors A1 and A2 and may retain 50% of duty cycle (Vout2). It may thus be ensured that the high-speed internal hysteresis comparator according to this embodiment outputs correct information.

Figure 5:
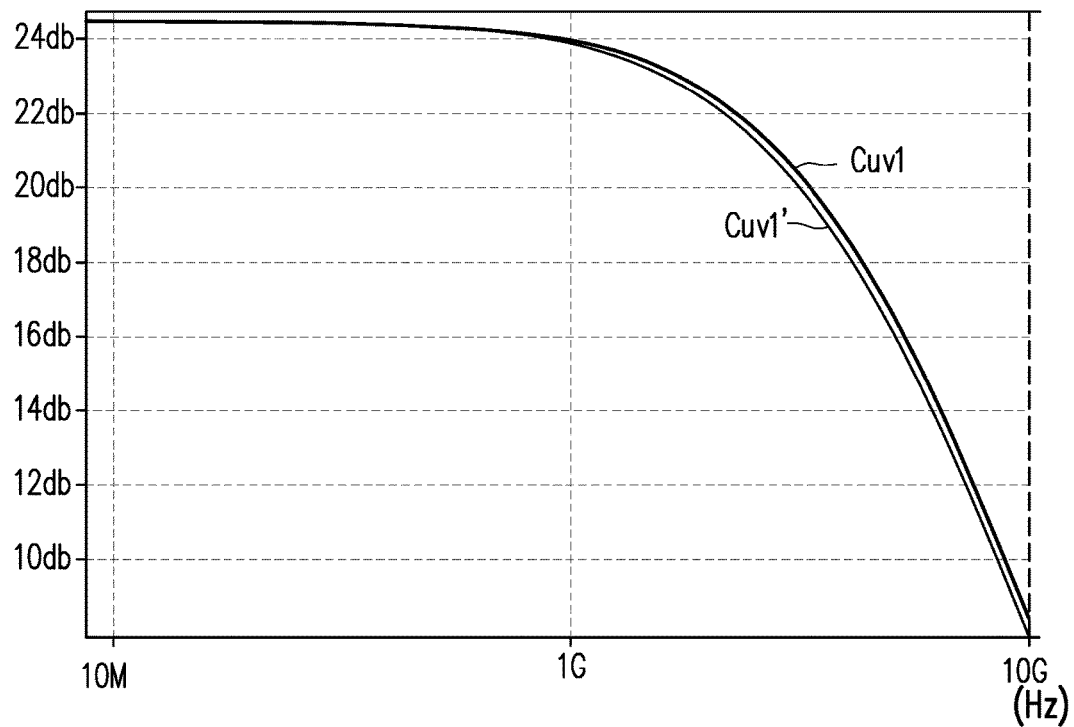
FIG. 5 is a schematic diagram of frequency responses of a high-speed internal hysteresis comparator according to an embodiment of the disclosure and a comparator according to prior art.
Figure 6:
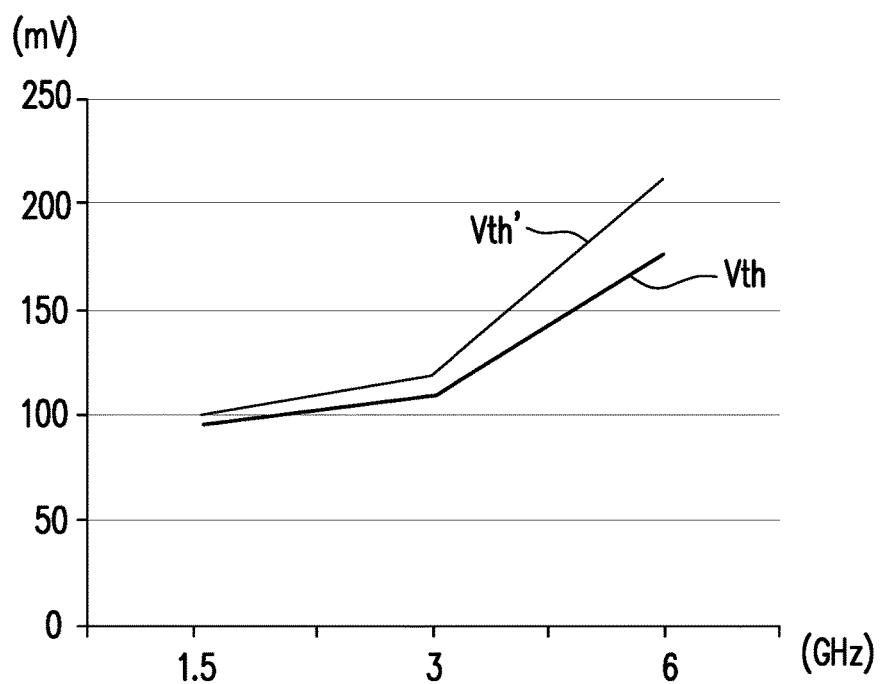
FIG. 6 is a schematic diagram of threshold voltages of a high-speed internal hysteresis comparator according to an embodiment of the disclosure and a comparator according to prior art.

Moreover, the high-speed internal hysteresis comparator according to this embodiment not only has the aforementioned advantages, but can further increase a bandwidth of the high-speed internal hysteresis comparator when operating in a linear region and improve an influence a frequency of an input signal has on a threshold voltage of the high-speed internal hysteresis comparator. As shown in FIG. 5 and FIG. 6, in FIG. 5, a curve Cuv1 is a frequency-responding curve correspondent to the high-speed internal hysteresis comparator according to this embodiment. A curve Cuv1' is a frequency-responding curve correspondent to the comparator of prior art. In view of FIG. 5, the high-speed internal hysteresis comparator according to this embodiment obviously has a better bandwidth. Moreover, in FIG. 6, a threshold voltage Vth represents a threshold voltage of the high-speed internal hysteresis comparator according to this embodiment, while a threshold voltage Vth' represents a threshold voltage of the comparator of prior art. A threshold voltage is a value which an input voltage difference must exceed to ensure an output result output by the comparator through digital logic circuit to be correct. In view of FIG. 6, a correspondent threshold voltage variation when a transmitting frequency of an input signal of the high-speed internal hysteresis comparator according to this embodiment increases from 1.5 GHz to 6 GHz is smaller than a threshold voltage variation of the comparator of prior art. Hence, characteristics of the high-speed internal hysteresis comparator according to this embodiment are more ideal comparing with characteristics of the comparator of prior art.

Figure 7:
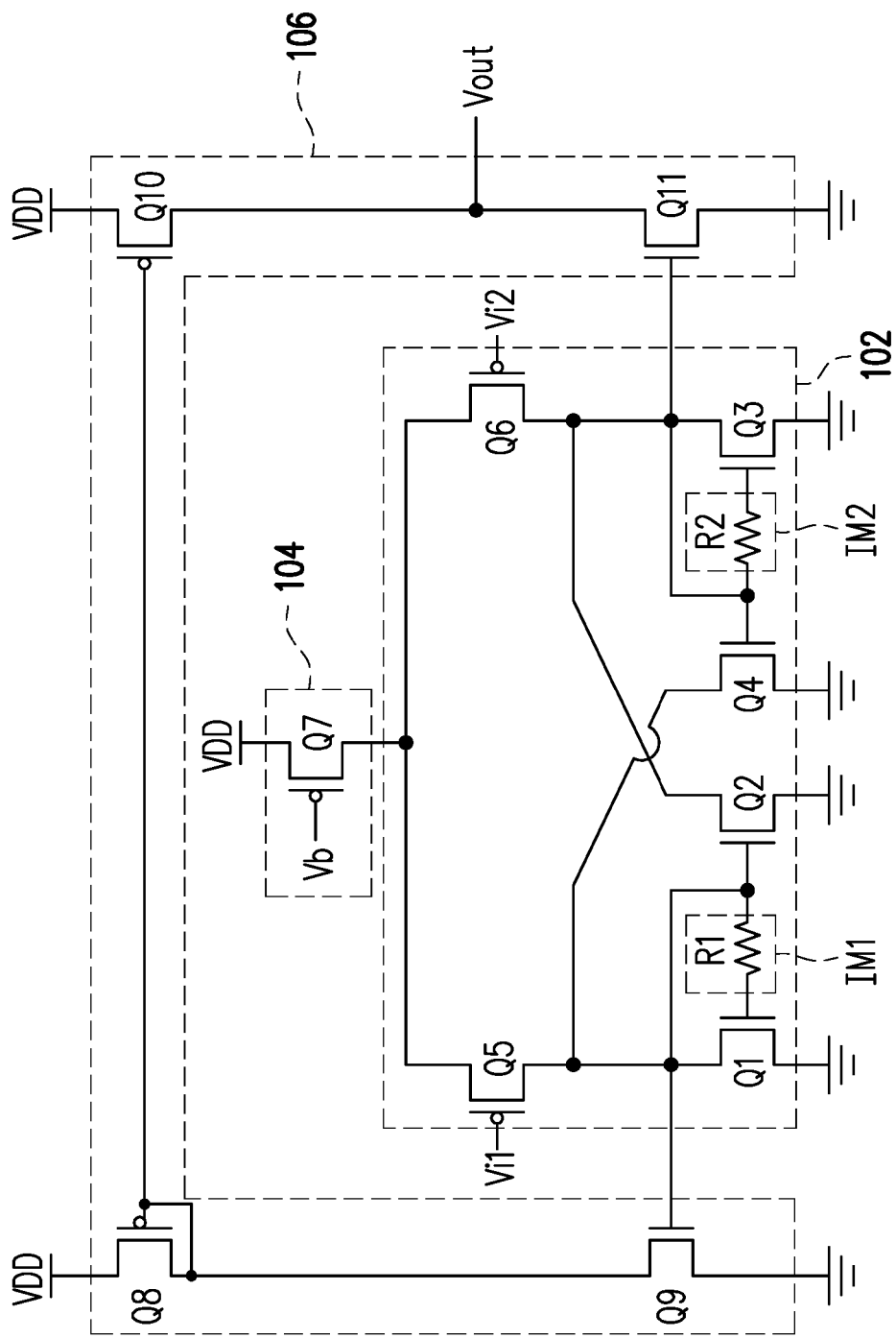
FIG. 7 is a schematic diagram of a high-speed internal hysteresis comparator according to another embodiment of the disclosure.

It should be noted that embodiments of the differential amplifier 102, the current source circuit 104, and the output circuit 106 included in the high-speed internal hysteresis comparator are not limited to the disclosed embodiments. For example, FIG. 7 is a schematic diagram of a high-speed internal hysteresis comparator according to another embodiment of the disclosure. Referring to FIG. 7, according to this embodiment, transistors different from types of the transistors in the embodiment of FIG. 1 may be employed as the differential amplifier 102, the current source circuit 104, and the output circuit 106. For example, according to this embodiment, N-type transistors Q1, Q2, Q3, and Q4 may be employed as the active load, P-type transistors Q5 and Q6 may be employed as the differential pair, a P-type transistor Q7 may be employed as the current source circuit 104, and P-type transistors Q8 and Q10 and N-type transistors Q9 and Q11 may be employed as the input circuit 106. This embodiment only differs from the embodiment of FIG. 1 in types of the transistors (i.e. the P-type and N-type transistors are respectively changed to N-type and P-type transistors). A circuit framework of this embodiment is overall similar to a circuit framework of the embodiment of FIG. 1. People having ordinary skills in the art should be able to understand employments of the circuit framework of this embodiment according to the aforementioned embodiment and figures. Coupling relationship thereof is thus not repeated hereinafter.

Figure 8:
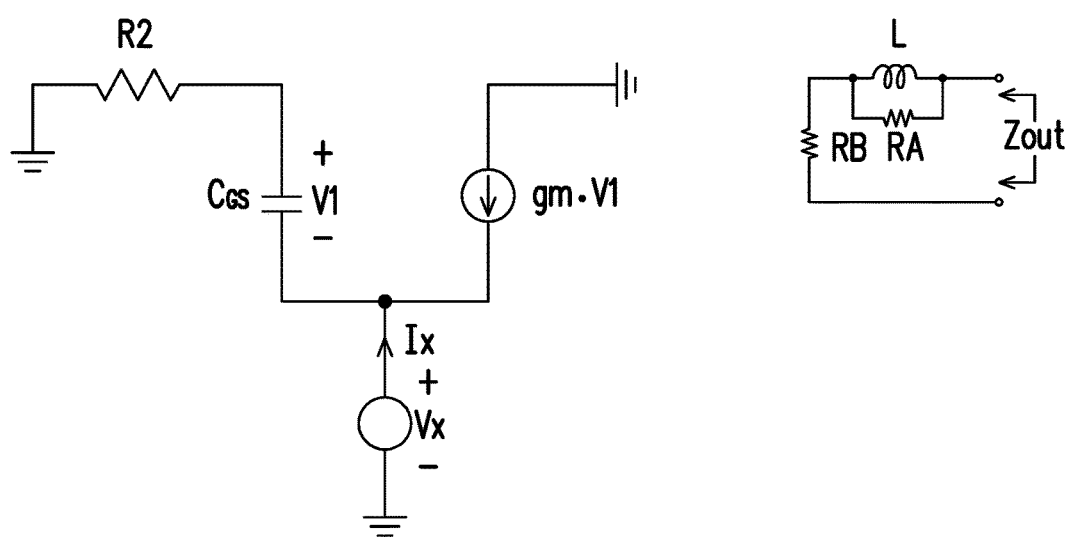
FIG. 8 is a schematic diagram of a small-signal model and a simplified network of a circuit consists of a transistor and an impedance supply unit according to another embodiment of the disclosure.

Similar to the embodiment of FIG. 2, FIG. 8 is a schematic diagram of a small-signal model and a simplified network of a circuit consists of a transistor and an impedance supply unit according to another embodiment of the disclosure. Referring to FIG. 8, FIG. 8 illustrates a small-signal model of a circuit consists of the transistor Q3 and electrical resistance R2. Equations such as the Equation (1) and the Equation (2) may also be obtained according to Kirchhoffs current law and Kirchhoffs voltage law. Equivalent impedance Zout at a second output terminal of a differential amplifier 102 is as shown in the Equation (3). Hence, the equivalent impedance Zout of the differential amplifier 102 according to this embodiment is also the same as the equivalent impedance Zout of the differential amplifier 102 according to the embodiment of FIG. 1: the impedance Zout has features of an inductive load such that a high-frequency gain when the transistor Q6 operates in an active region is effectively increased and a responding speed of the high-speed internal hysteresis comparator is further increased according to both embodiments. The high-speed internal hysteresis comparator thus outputs a correct comparing result. Moreover, a simplified network structure according to this embodiment is similar to the simplified network structure according to the embodiment of FIG. 2. As shown in FIG. 8, electrical resistance RB is connected in series with electrical resistance RA and inductance L that are connected together in parallel. Equivalent impedance Zout is equivalent impedance of the simplified network, wherein the electrical resistance RA and RB and the inductance L may also be shown as the Equations (4), (5), and (6). It is thus not repeated here.

In conclusion of the foregoing, impedance supply units disposed at control terminals of transistors of an active load of differential amplifier enable the transistors to be inductive, such that high-frequency impedance when the transistors of an active load operate in an active region is increased, and a high-frequency gain and a responding speed of the high-speed internal hysteresis comparator are further increased. The high-speed internal hysteresis comparator outputs a correct comparing result correspondent to an input signal of high transmitting speed without causing problems such as high power consumption, high costs, increase in circuit area, etc. Moreover, the high-speed internal hysteresis comparator further has the advantages in increasing a bandwidth when operating in a linear region and improving an influence a frequency of an input signal has on a threshold voltage.

What is claimed is:

1. A high-speed internal hysteresis comparator comprising:
 a differential amplifier comprising:
  an active load coupled to an electrical source terminal and an output terminal of the differential amplifier, the active load comprising:
   a first transistor, a first terminal and a second terminal of the first transistor respectively being coupled to the electrical source terminal of the differential amplifier and a first output terminal of the differential amplifier;
   a second transistor, a first terminal and a second terminal of the second transistor respectively being coupled to the electrical source terminal of the differential amplifier and a second output terminal of the differential amplifier, a control terminal of the second transistor further being coupled to the second terminal of the first transistor;
   a first impedance supply unit coupled between a control terminal of the first transistor and the control terminal of the second transistor and providing first impedance;
   a third transistor, a first terminal and a second terminal of the third transistor respectively being coupled to the electrical source terminal of the differential amplifier and the second output terminal of the differential amplifier;
   a fourth transistor, a first terminal and a second terminal of the fourth transistor respectively being coupled to the electrical source terminal of the differential amplifier and the first output terminal of the differential amplifier, a control terminal of the fourth transistor being further coupled to the second terminal of the third transistor; and
   a second impedance supply unit coupled between a control terminal of the third transistor and the control terminal of the fourth transistor and providing second impedance.

2. The high-speed internal hysteresis comparator according to claim 1, wherein the first impedance supply unit and the second impedance supply unit enable output impedance at the output terminal of the differential amplifier to have features of an inductive load in a small-signal model.

3. The high-speed internal hysteresis comparator according to claim 1, wherein the first impedance supply unit and the second impedance supply unit respectively comprise electrical resistance.

4. The high-speed internal hysteresis comparator according to claim 1, wherein the first impedance supply unit and the second impedance supply unit respectively comprise a transistor.

5. The high-speed internal hysteresis comparator according to claim 1, wherein the differential amplifier further comprising:
 a differential pair coupled to the active load and a current terminal of the differential amplifier, and receiving a differential input signal.

6. The high-speed internal hysteresis comparator according to claim 5, wherein a transmitting speed of the differential input signal is greater than or equal to 6 Gb/s.

7. The high-speed internal hysteresis comparator according to claim 1 further comprising:

a current source circuit coupled to the current terminal of the differential amplifier.

8. The high-speed internal hysteresis comparator according to claim 1 further comprising:
   an output circuit coupled to the first output terminal of the differential amplifier and the second output terminal of the differential amplifier, a comparative signal is output from the output terminal of the differential amplifier according to a signal at the first output terminal of the differential amplifier and a signal at the second output terminal of the differential amplifier.

\* \* \* \* \*